United States Patent
Knierim et al.

(10) Patent No.: US 10,365,300 B2
(45) Date of Patent: Jul. 30, 2019

(54) TRIGGER ON FINAL OCCURRENCE

(71) Applicant: Tektronix, Inc., Beaverton, OR (US)

(72) Inventors: Daniel G. Knierim, Beaverton, OR (US); David L. Kelly, Portland, OR (US); Patrick A. Smith, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 198 days.

(21) Appl. No.: 15/395,593

(22) Filed: Dec. 30, 2016

(65) Prior Publication Data

US 2017/0227581 A1    Aug. 10, 2017

Related U.S. Application Data

(60) Provisional application No. 62/292,085, filed on Feb. 5, 2016.

(51) Int. Cl.
*G01R 23/16*    (2006.01)
*G01R 13/02*    (2006.01)

(52) U.S. Cl.
CPC ..... *G01R 13/0254* (2013.01); *G01R 13/0245* (2013.01)

(58) Field of Classification Search
CPC ............... G01R 13/02; G01R 13/0254; G01R 13/0245; G01R 13/029; G01R 13/0227; G01R 13/0263
See application file for complete search history.

(56) References Cited

U.S. PATENT DOCUMENTS

| | | | |
|---|---|---|---|
| 2010/0228508 A1 | 9/2010 | Smith et al. | |
| 2011/0060541 A1* | 3/2011 | Bartlett | G01R 13/0254 702/67 |
| 2011/0134979 A1 | 6/2011 | Rule | |
| 2011/0137594 A1* | 6/2011 | Sullivan | G01R 13/0236 702/68 |
| 2014/0236539 A1* | 8/2014 | Lehane | G06F 17/00 702/190 |
| 2014/0269867 A1* | 9/2014 | Meller | H04B 3/46 375/224 |
| 2015/0293170 A1 | 10/2015 | Knierim et al. | |
| 2015/0349983 A1* | 12/2015 | Guzik | H04L 25/03343 375/232 |
| 2016/0085223 A1* | 3/2016 | Lehane | G01R 13/0272 326/46 |

OTHER PUBLICATIONS

European Patent Office, Extended European Search Report and Written Opinion for European Patent Application 17154703, 2017-23-16, 6 pages, European Patent Office, Munich, Germany.

* cited by examiner

*Primary Examiner* — Thang X Le

(74) *Attorney, Agent, or Firm* — Miller Nash Graham & Dunn; Andrew J. Harrington

(57) ABSTRACT

This disclosure relates generally to test and measurement instruments structured to detect that a series of events occurred, and structured to generate a trigger signal in response to detecting that a final event in the series of events occurred. The trigger may be generated based on a timeout signal, or based on another event, trigger, or signal. Stored data in the acquisition memory may be marked relative to the detection of the final event. An external forced timeout signal may control which in a series of events is marked as a final event. The triggering on final event may be enabled after another trigger is satisfied, and may be used as one of many different types of triggers.

20 Claims, 4 Drawing Sheets

TRIGGER ON FINAL OCCURRENCE

CROSS REFERENCE TO RELATED APPLICATIONS

This application is a non-provisional of and claims benefit to U.S. Provisional Patent application 62/292,085, filed Feb. 5, 2016, entitled TRIGGER ON FINAL OCCURRENCE, the contents of which are incorporated herein by reference.

TECHNICAL FIELD

This disclosure relates generally to test and measurement instruments such as digital oscilloscopes and more particularly, to triggering modes in such instruments.

BACKGROUND OF THE INVENTION

In recent years, several high speed serial data communication standards, such as PCIe and Ethernet, have defined a set of initiating sequences between nodes on a data channel to optimize a maximum speed of communication over the data channel. These initiation or training sequences have a defined protocol with a definite starting point but a widely variable duration, which is largely dependent on the amount of attenuation in the serial channel. For 100 Gbps Ethernet, the training sequence can range in duration from 200 ms to 500 ms. Users have a desire to be able to determine the results of a final action in the training sequence, e.g. to determine the final results of the agreed protocol, but there is no present way to directly capture such results.

Despite the very long data record lengths used in present oscilloscopes, when initiating high speed data channels, the scope is often unable to fully capture the complete training sequence. Even if the data acquisition memory in the scope could store a long enough record to capture the entire training sequence, the amount of time required to process such a large record is many minutes, and would negatively impact the throughput of the instrument. Therefore, a software search for the final sequence also does not satisfy needs of the users, due to the long delay in processing such a long record.

Embodiments of the invention address these and other limitations of the prior art.

DETAILED DESCRIPTION

A variety of known triggering techniques are described in "Triggering Fundamentals" www.Tektronix.com/oscilloscopes, Copyright 2011 Tektronix, which is hereby incorporated by reference.

Embodiments of the invention are directed to triggering on the final occurrence of an event. As described in the Triggering Fundamentals reference, it is known to trigger on a new event—for example, if a signal on a particular input channel of an oscilloscope changes from HIGH to LOW, or when an input signal crosses a pre-set threshold level. Also, the trigger event need not necessarily be based on data that is being received by the input channel of the oscilloscope, but instead may be from a different source, such as a time period expiring, or other external event. The trigger event can cause many things to happen in or on the scope, such as stopping data from the input channel being stored in an acquisition memory after a certain post-trigger delay from the triggering event and subsequently being displayed, analyzed, stored to non-volatile memory, etc.

There is sometimes a need, however, to capture data related to a "final" occurrence of an event in a series of events. In present oscilloscopes, there is no way to distinguish the input data related to a final occurrence of an event. Embodiments of the invention, conversely, purposely continue storing data in the acquisition memory after each event and then, after the final trigger event occurs, mark a certain location in the previously stored data as the beginning of the data of interest. Many details and variations of this concept are set forth in detail below.

To trigger on the "final" occurrence of an event presumes that there are non-final events that may be ignored. For instance, if a particular data pattern repeats eight times, the first seven times the pattern repeats are non-final events, while the eighth repetition is the final occurrence. This may be relatively easy to track when the number of recurrences is known, but it is much more difficult to ascertain the final occurrence when the number of recurrences is unknown, or more difficult still, variable. Therefore, embodiments of the invention use a number of different methods and techniques to determine when a particular occurrence of an event is a final occurrence. Then, after the final occurrence is identified, data about the final occurrence may be retrieved and analyzed, for instance.

Figure 1:
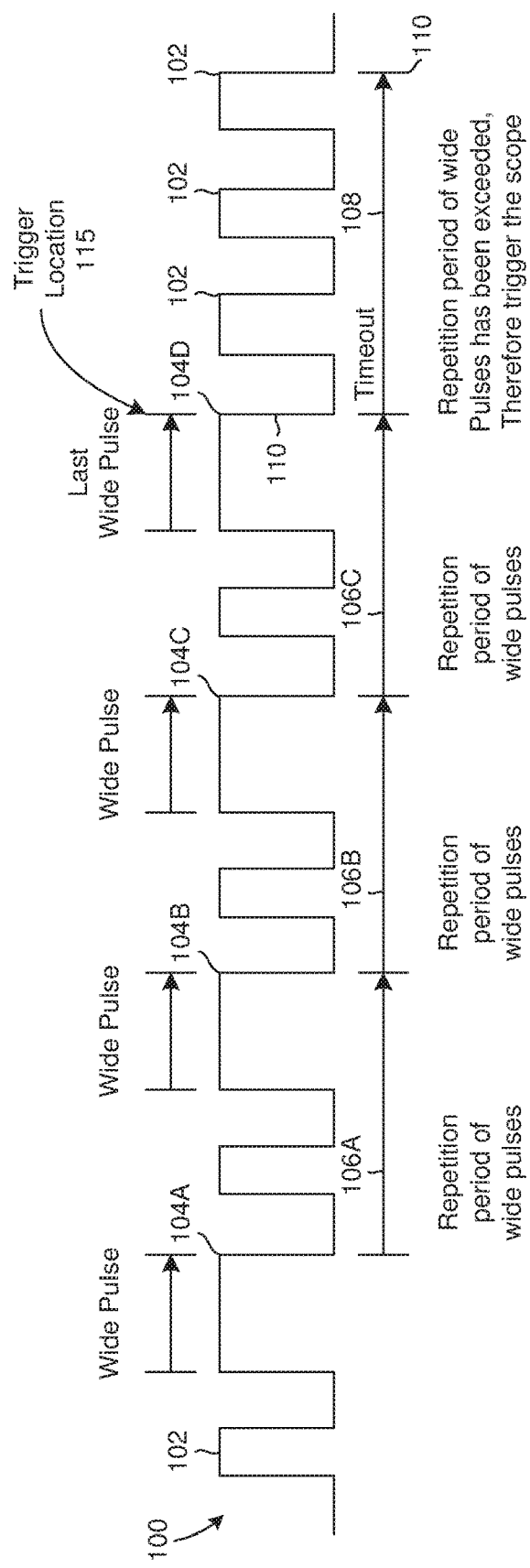
FIG. 1 is an example of generating a trigger on a final occurrence of a repeating pattern according to embodiments of the invention.

FIG. 1 is an example waveform diagram that shows a simplified example of the trigger on final occurrence in a test instrument such as an oscilloscope.

In this example there are a series of wide pulses 104A-104D as well as a number of narrow pulses 102 in a waveform 100. The oscilloscope is trying to determine which of the wide pulses 104 in the waveform 100 is the final occurrence of the wide pulse. In this example, a timer helps determine the final occurrence of the wide pulse 104. With reference to the waveform 100, there is a repetition period 106 that follows each wide pulse 104. For example, a repetition period 106A is the time between wide pulse 104A and 104B. A next repetition period 106B follows the wide pulse 104B, etc. Each repetition period 106 has a maximum duration, which may be measured by a timer (not illustrated, but very common on oscilloscopes). One way to determine that the last wide pulse 104D is the final occurrence in the waveform 100 is to set a timer to timeout at the maximum duration of the repetition period 106. If the event has not repeated by the end of the timeout period, then the last event previously received by the oscilloscope is determined to be the last in the series. This determination may be used to stop data storage in the acquisition memory and initiate display, analysis, non-volatile storage, etc. In the illustrated example, a timeout period 108 exceeds the maximum length of the repetition period 106. Therefore, the oscilloscope determines, since no wide pulse 104 occurred within the timeout period following 106C, that the wide pulse 104D is the last or final occurrence of wide pulses 104 in the waveform 100. In this example, the determination is made at the time reference 110, which is determined by adding the timeout period 108 to the end of the last repetition period 106C. Thus, the last wide pulse 104 is the wide pulse that occurred before the timeout period 108, which, as illustrated, is the wide pulse 104D.

The timeout period 108 may be determined in a number of ways. For example, it may be pre-set if the maximum duration of the repetition period 106 is known. It may also be automatically calculated by measuring an average number of repetition periods, then adding a timeout margin. For example, if the average repetition period 106 is empirically determined to be 15 µs, then a timeout period 108 could be set at 17 µs, 20 µs, or any other time longer than 15 µs, for instance, depending on how tight of a tolerance to the average repetition period was desired. The timeout period may also be set as just above the maximum duration of a number of repetition periods observed during a testing period. For example, if after a sampling period the maximum repetition period was determined to be 88 ms, then a timeout period could be set at 90 ms. Of course, other methods of setting a timeout period are also possible, and embodiments of the invention may work with any of such methods.

After the final occurrence of the repeated event has been determined, the oscilloscope determines the trigger location, for example, the trigger location 115 for the waveform 100. In prior-art trigger operation, the trigger location within an acquired record may be determined by subtracting the post-trigger delay from the end of the acquired record. However, since the final occurrence of a trigger event may not be determined at the time of occurrence, a different method is required. One method of determining a trigger location of the final occurrence is to subtract the timeout period 108 from the point in time, 110, where the timeout occurred and the acquisition ended. Thus, subtracting the timeout period 108 from the timeout point 110 gives the trigger location 115 at the falling edge of the last wide pulse 104D (the time at which 104D is identified as a wide pulse, but well before it could be determined to be the final wide pulse). Data about the waveform 100, or the waveform 100 itself, is stored in an acquisition memory of the oscilloscope beginning before the trigger location 115. In practice, the data about the waveform 100 may have already been stored in the acquisition memory, which is set to operate as a circular buffer. In other words, prior to a triggering event, the acquisition memory may be storing the waveform data 100 as it is being provided to the oscilloscope, but, since there is only a finite amount of acquisition memory available, the oldest waveform data 100 is overwritten by the new data as the waveform 100 continues. Normally, the circular buffer is sized to capture a desired amount of data both before and after the trigger event, and the post-trigger delay is set to continue acquisition for just the duration of the desired data after the trigger event. Embodiments of the invention, however, size the circular buffer to continue storing data during the timeout period without overwriting the desired pre-trigger data, then after the trigger point is established, effectively "retrieve" the information previously stored in the acquisition buffer that would have been overwritten had the circular buffer size not been increased. In other words, embodiments of the invention calculate what data from the acquisition buffer needs to be saved, and mark such data surrounding the calculated final occurrence time as data of interest to the trigger. In some contexts, this marking of the data of interest is known as timestamping, or generating a timestamp in the data acquisition memory. In the example illustrated in FIG. 1, assume that the waveform 100 is being acquired and saved in acquisition memory. Until the trigger is tripped, none of the data in the acquisition memory is marked as being important or needing to be saved. After the timeout point 110, the oscilloscope then marks or timestamps already-acquired data in the acquisition memory as being important, beginning before the trigger location 115 by the desired pre-trigger time. More details of this operation appear below. Including a very accurate timeout timer, such as a crystal controlled clock in the oscilloscope, gives a very accurate location to the trigger point determined using the process above. If the timeout timer is not extremely accurate, additional data prior to a calculated trigger point may be included as part of the timestamped triggered data to ensure that important data is not lost from the acquisition memory.

Figure 2:
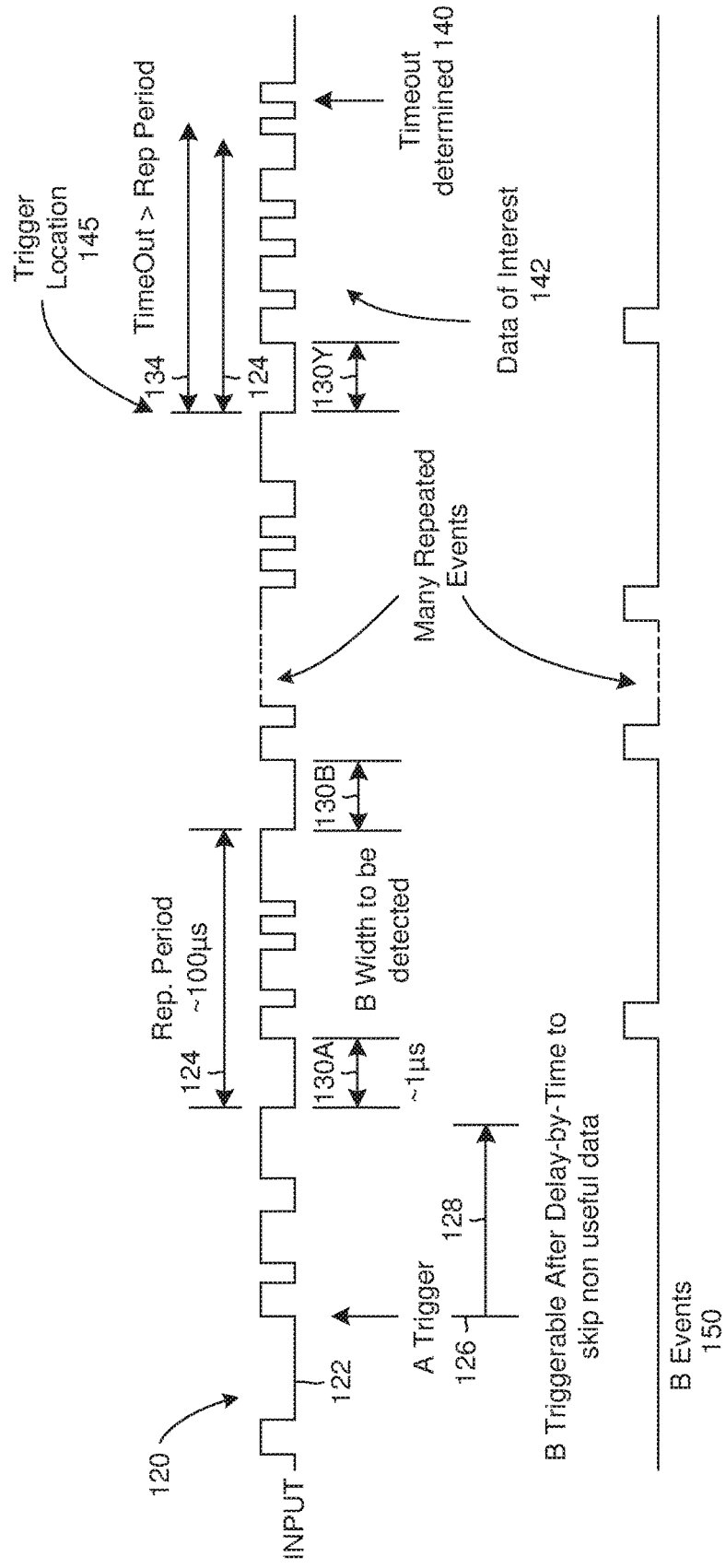
FIG. 2 is an example diagram of a training sequence illustrating how embodiments of the invention may be used in conjunction with multiple triggers.

FIG. 2 illustrates a more complex method of determining a trigger based on a final occurrence of an event. Whereas the example illustrated in FIG. 1 involved only a single factor, i.e., a timeout, the example in FIG. 2 illustrates a two-stage determination. In particular, the example diagram in FIG. 2 represents a training sequence used to establish data communication speed for 100 Gbps Ethernet. Data that is of interest by a user is illustrated generally as Data of Interest 142. Embodiments of the invention allow such data of interest 142 to be isolated in a straightforward manner, while presently it is very difficult to isolate such data.

The protocol of this Ethernet training signal 120 includes a first initialization stage followed by a repetitive training stage. Ordinarily, but not essentially, the initialization signal in the training signal 120 is an analog signal. As described above, various inputs may be used for triggers. For the 100G Ethernet standard, the training signal 120 is first analyzed for an initialization signal 122, which is considered an "A" trigger. After the initialization signal 122 is received, indicated by the long pulse after the initialization stage, the A trigger is satisfied, and the oscilloscope begins evaluating the training signal 120 for a "B" trigger. In this example, the B trigger is a final B event in a series of B events, similar to the timeout example described above. In the Example illustrated in FIG. 2, a unique starting point 126 is established at the A trigger, which, in turn, enables the B trigger. The starting point 126 begins a period during which the oscilloscope determines a final occurrence of a "B" event in the training data signal 120. Although there may be a substantial period of time following the starting point 126, using the B trigger-after-delay-by-time enables the oscilloscope to effectively discard or skip a portion 128 of the training signal 120, by not capturing (or at least not keeping, i.e., by overwriting in the acquisition memory buffer) the training data signal 120 during the portion 128 between the A and B triggers, and the unimportant periods of repetition during B events 150. This configuration of triggers allows a B trigger to be set up to find a header of control data that is repeated during the training sequence for the 100 Gbps Ethernet setup, the last incidence of which is the section of data of interest 142 to the user.

In this example, the B trigger is in a Pulse Width mode, which searches for relatively long pulses 130 to indicate B events 150. A "B" event 150 is indicated in FIG. 2 as the wide pulse 130 in the training signal 120. B events 150 are also illustrated as isolated pulses near the bottom of FIG. 2. The B events 150 repeat approximately every 100 µs, which is used as the repetition period 124. In FIG. 2, a first B event 150 occurs at the conclusion of the time period indicated as 130A, while a second B event occurs just after the time period 130B. Then many B events 150 repeat, as indicated by the dotted lines in the training signal 120 and B events graph 150. In real test cases, the B event 150 may repeat hundreds or thousands of times, which illustrates why embodiments of the invention, which effectively skip over the repeated events to select the final event, is very useful. The B events 150 continue until the final B event illustrated at the conclusion of time period 130Y.

A timeout circuit measures the amount of time following each time period 130, and determines a timeout 140 occurs only when the training signal 120 progressed longer than the timeout period after a B event 150. In other words, with reference to FIG. 2, the timeout period is illustrated as 134, while the repetition period is illustrated as 124. Beginning at the pulse 130Y, a timing circuit determines that the training signal 120 continued longer than the timeout period 134 without generating another B pulse. Thus, the timeout was determined to occur at point 140, and the B pulse 150 following the time period 130Y was determined to be the final occurrence of the B pulse. Then, as described above, the proper trigger location 145 to capture the final B pulse 150 is determined by subtracting the timeout period 134 from where the timeout occurred at 140. Therefore, the trigger location is set as the beginning of the pulse 130Y, which is the correct location to reference as the trigger point when locating the data of interest 142 within the acquisition memory.

Figure 3:
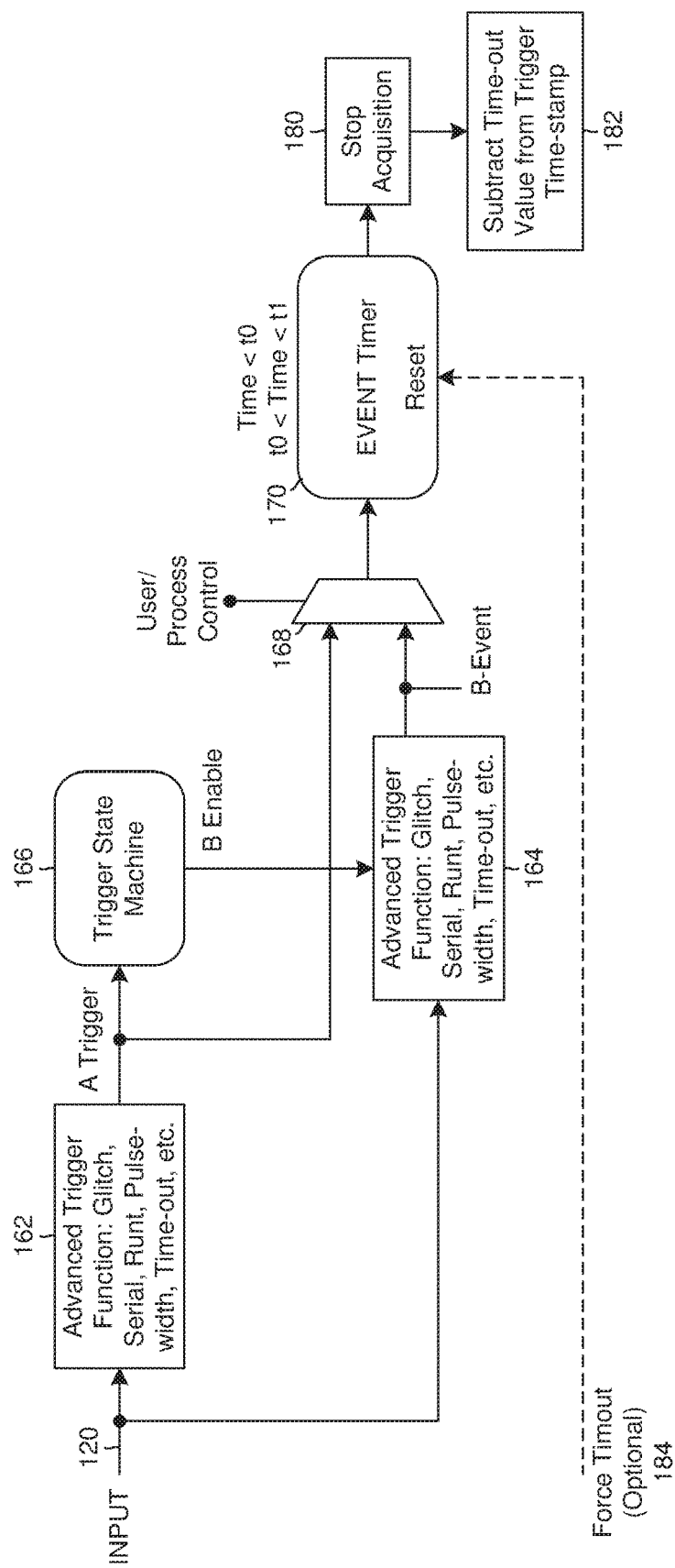
FIG. 3 is a signal flow diagram of an example implementation of the trigger on final occurrence according to embodiments of the invention.

FIG. 3 illustrates an example flow diagram illustrating how the training signal 120 of FIG. 2 may be evaluated using triggers according to embodiments of the invention. With reference to FIG. 2 and FIG. 3, an input receives the training signal 120 and then an evaluation operation 162 determines whether Trigger A has occurred. In FIG. 2, Trigger A was a particular analog signal 122, but embodiments of the invention may use any type of Trigger as the Trigger A. For example, Trigger A could be any trigger type, such as glitch, serial, runt, pulse-width, time-out, etc. or any other known type of trigger, or a final event trigger according to embodiments of the invention.

If the A trigger is the only trigger in the system being evaluated, a multiplexer 168 may be set to only evaluate the A trigger by changing the control input, and not consider the B trigger. In such an instance, the remainder of the flow continues as described in more detail below.

If instead of merely evaluating an A trigger, both an A trigger and a B trigger are being considered, then a trigger state machine 166, upon receiving the A trigger from operation 162, enables the B trigger to be evaluated in a B trigger evaluation operation 164. The trigger state machine 166 may also switch the multiplexer 168 to evaluate for B events. In FIG. 2, the B trigger evaluation was a final B event, as described above. Embodiments of the invention may work with any type of trigger, however.

As described with reference to FIG. 2, an event timer 170 is set to time out at a particular time to determine when the last B event occurred. Or, if the system were set up to monitor a last A event, by enabling the multiplexer 168 to evaluate the A trigger, then the system illustrated in FIG. 3 could search a data stream for a last A event. No matter which "final event" the system illustrated in FIG. 3 is searching for, the event timer 170 monitors the system to determine if a timeout time has passed since the last B (or A, if selected by the multiplexer 168) event. If the B event recurs within the timeout period, then effectively nothing happens and no B trigger is triggered. If instead no B event occurs within the timeout period, then the B trigger is satisfied, because a 'final' B event has occurred. When the B trigger is satisfied, the acquisition of data stops in an operation 180, meaning that new data is prevented from being stored in the acquisition memory of the oscilloscope, or at least a portion of the acquisition memory is marked to be saved. Then, in an operation 182, the time-out value is subtracted from the time of the timeout event, and a trigger timestamp is generated at the point of data in the acquisition memory where the last B event occurred. This was illustrated in FIG. 2 by subtracting the timeout period 134 from the determination of timeout 140, to mark the proper trigger location 145. Then the data of interest, for example the data of interest 142 in FIG. 2 may be evaluated by the user.

In some embodiments, the event timer 170 may include more than a simple timeout. For example, in some embodiments, the event timer may be set to skip over intermediate time values between a pair of two time values, but determine a final event based on a time value outside the pair of two time values. For example, the timer 170 may be set to trigger a final B event if no event occurred before a timeout, using a maximum timer, as described above. A minimum timer may also be employed to ensure that a (settable) time passes between two adjacent pulses. And, if two adjacent pulses occur within the minimum time, then either of the pulses may be selected as being the pulse of interest, and the appropriate timestamp generated to mark the acquisition data of interest.

The event timer 170 may include any type of timer, such as count-down, count-up, interval, shift-register, analog ramp, or other type of timer.

Along the same lines, a force timeout signal 184 may operate in conjunction with the event timer 170 to provide additional control to the user. For example, a force timeout 184 signal may be used to prevent the timeout timer in the event timer 170 from being reset on any new input events, and therefore forces the timer 170 to declare the final event that passed before the force timeout signal 184 was asserted to be the final event, regardless of whether additional events actually occur in the data after the force timeout signal 184 was asserted. The force timeout signal 184 may be asserted by the user in a situation where the user wishes to study a particular portion of the data stream. In such a configuration, where the force timeout 184 is used, the timestamp subtraction operation 182 still operates, and the data trigger timestamp in the acquisition memory is set to be the final event prior to assertion of the force timeout signal 184.

In another mode, the force timeout signal 184 may be used to immediately stop acquisition of data in the acquisition memory, because the user knows that the final occurrence has already been captured and stored in acquisition memory. In this embodiment, the timestamp subtraction 182 may be omitted if temporary timestamps are generated for the acquisition memory as each event occurs. For example, with reference to FIG. 2, if a final occurrence temporary timestamp was generated for each time a B event 150 occurred, then the force timeout signal could cause the oscilloscope to immediately mark the last-occurring temporary timestamp as the final occurrence timestamp, and the data surrounding such a timestamp as the data of interest.

Although the Example shown in FIG. 2 is specifically for 100 Gbps Ethernet Link training, embodiments of the invention may be used in many situations where data of interest is near the last occurrence of an event. For example, many data negotiation protocols used to set a channel speed include a designated start point followed by a pattern that repeats with a regular interval or until a reset event, and then has an end point. Embodiments of the invention may be used to search for the designated start point (as Trigger A), then use the trigger on final occurrence feature as Trigger B, to capture and select the data of interest. For some patterns or sequences, an A-B sequence trigger may not be needed, so some embodiments may be set to evaluate an A trigger only, as illustrated in FIG. 1.

Figure 4:
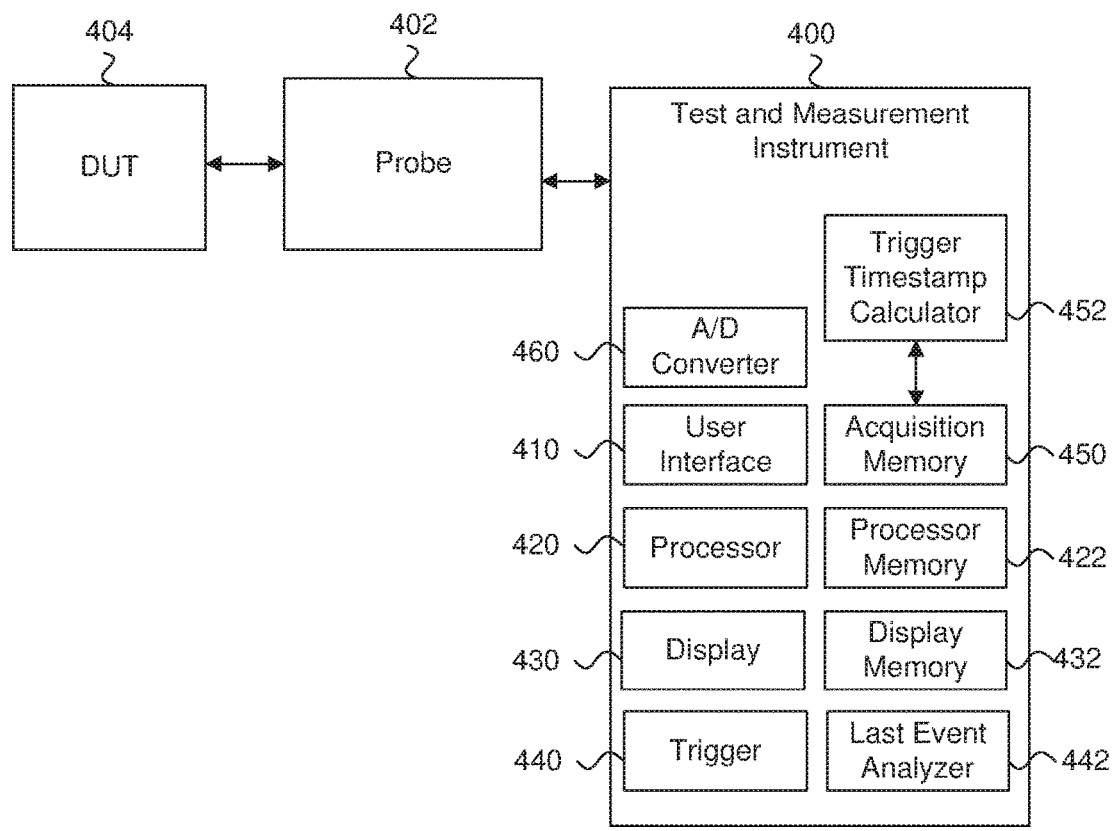
FIG. 4 is a block diagram of an example of a test and measurement system in which one embodiment of the trigger on final occurrence is implemented.

FIG. 4 is a block diagram illustrating example components of a test and measurement system including a test and measurement instrument 400 coupled via a test probe 402 to a device under test (DUT) 404. The test and measurement instrument 400 may be an oscilloscope or other type of instrument. The test and measurement instrument includes a user interface 410, a processor 420 coupled to processor memory 422, and a display 430 coupled to display memory 432. The processor 420 may be programmed to operate based on instructions stored on the processor memory 422, which may be read only memory, random access memory, flash memory, codes stored on an FPGA or other reprogrammable circuit, or other forms of memory.

The test and measurement instrument 400 includes input circuitry for receiving an input signal from the DUT 404 via the probe 402 and outputting a digital signal to the processor. The input signal is typically an analog signal but is converted to digital form by an analog-to-digital (A/D) converter 460 within the instrument 400. The processor 420 is operative to receive and process the digital signal and to output one or more signals derived therefrom.

An acquisition memory 450 stores input signals from the DUT 404. As described above, the acquisition memory 450 may be configured as a circular buffer, which overwrites the oldest acquired signals with newer acquired signals on a rolling basis.

A trigger subsystem 440 includes one or more trigger event decoders operative responsive to one or more features of the input signal or the digital signal, or based on other signals such as the force timeout signal 184 (FIG. 3) to initiate or end an acquisition of the signal and to control storage of the digital signal in memory. The trigger subsystem may be configured to operate as illustrated in the flow of FIG. 3, and may be configured to analyze an input signal as describe above with reference to FIGS. 1 and 2 above. The trigger subsystem 440 may include a last event analyzer 422, which may operate as set forth above to generate a trigger signal when the last event of a series of events has occurred in the input signal. Based on such a last event trigger from the last event analyzer 422, or based on other triggering events, a trigger timestamp calculator determines which data already stored in the acquisition memory 450 is marked as data of interest. In other embodiments the last event analyzer 442 may initiate other processes, such as enabling other triggers to be set as an active trigger by the test and measurement system 400. In yet other embodiments the last event analyzer 442 or other functions in the trigger subsystem 440 may initiate or end an acquisition following a programmed period of time after the last occurrence of a trigger event. The timestamp calculator 452 is then operative to position the digital signal stored in the acquisition memory according to the time of occurrence of the last trigger event.

EXAMPLES

Illustrative examples of the technologies disclosed herein are provided below. An embodiment of the technologies may include any one or more, and any combination of, the examples described below.

Example 1 includes a test and measurement instrument comprising an input circuit for receiving an input signal; an acquisition memory structured to store a digital signal related to the input signal; and a trigger subsystem having one or more event decoders operative responsive to one or more features of the input signal or the digital signal to detect that a series of events occurred, and structured to generate a trigger signal in response to detecting that a final event in the series of events occurred.

Example 2 includes the test and measurement instrument of Example 1, or any other example test and measurement instrument described herein, in which the trigger subsystem includes a trigger-on-final-event timer to store a final event duration, and in which generating the trigger signal occurs when no event of the series of events occurs within the final event duration after the occurrence of last previously determined event in the series of events.

Example 3 includes the test and measurement instrument of Example 2, or any other example test and measurement instrument described herein, in which the trigger-on-final-event timer is a timer that begins when an event is detected, and in which generating the trigger signal is suppressed when an event in the series of events is detected before the trigger-on-final-event timer expires.

Example 4 includes the test and measurement instrument of Example 3, or any other example test and measurement instrument described herein, in which the trigger-on-final-event timer is reset when an event in the series of events is detected.

Example 5 includes the test and measurement instrument of Example 2, or any other example test and measurement instrument described herein, in which the trigger-on-final-event timer is crystal controlled.

Example 6 includes the test and measurement instruments of Examples 1-5, or any other example test and measurement instrument described herein, further comprising a timestamp indicator structured to indicate a timestamp associated to a particular portion of the data stored in the acquisition memory when the trigger signal is generated.

Example 7 includes the test and measurement instrument of Example 6, or any other example test and measurement instrument described herein, in which the timestamp is associated to a portion of the data related to the final event in the series of events.

Example 8 includes the test and measurement instrument of Example 6, or any other example test and measurement instrument described herein, in which the trigger subsystem includes a trigger-on-final-event timer to store a final event duration, and in which the timestamp is generated by subtracting the final event duration from a time when a timeout was determined to have occurred.

Example 9 includes the test and measurement instrument of Example 6, or any other example test and measurement instrument described herein, in which the timestamp indicator locates an approximate location of the final event in the stored digital data, and further comprising a correction facility structured to analyze the stored digital data to determine a specific location of the final event in the stored digital data.

Example 10 includes the test and measurement instrument of Examples 1-9, or any other example test and measurement instrument described herein, in which the trigger subsystem includes an input structured to receive a forced timeout signal, and in which, when the forced timeout signal is received, the trigger subsystem indicates the final event in the series events is the event most previously received before the forced timeout signal was received.

Example 11 includes the test and measurement instrument of Examples 1-10, or any other example test and measurement instrument described herein, in which the digital data stored in the acquisition memory is marked with a temporary timestamp at detected events in the series of events.

Example 12 includes the test and measurement instrument of Examples 1-11, or any other example test and measurement instrument described herein, in which the trigger system is structured to detect a first triggering event in the input signal or the digital signal before enabling the detection of the series of events.

Example 13 includes processor controlled method of generating a trigger in a test and measurement instrument, comprising accepting an input signal; digitizing the input signal into a digital signal; storing the digital signal in an acquisition memory; evaluating the input signal or the digital signal for events in a series of events; and generating the trigger when a final event in the series of events is detected.

Example 14 includes processor controlled method of Example 13, or any other example method described herein, in which generating the trigger comprises starting a timer when an event in the series of events is detected; and generating the trigger if the timer finishes before detecting a next event in the series of events.

Example 15 includes processor controlled methods of Examples 13-14, or any other example methods described herein, in which the timer is a crystal controlled timer.

Example 16 includes processor controlled methods of Examples 13-15, or any other example methods described herein, further comprising indicating a timestamp in relation to the acquisition memory when the final event in the series of events occurs.

Example 17 includes processor controlled method of Examples 13-16, or any other example methods described herein, further comprising refining a location of the timestamp by evaluating data stored in the acquisition memory.

Example 18 includes processor controlled methods of Examples 13-14, or any other example methods described herein, further comprising detecting the final event in the series of events; and generating a timestamp in the acquisition memory by subtracting a period of time stored in the timer from a point in time when the final event in the series of events was detected.

Example 19 includes processor controlled methods of Examples 13-18, or any other example methods described herein, further comprising receiving a forced timeout signal, and in which an event of the series of events received prior to receiving the forced timeout signal is deemed to be the final event in the series of events.

Example 20 includes processor controlled methods of Examples 13-19, or any other example methods described herein, in which the series of events are not evaluated for a final event until another event occurs, the other event unrelated to the series of events.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific embodiments of the invention have been illustrated and described for purposes if illustration, it will be understood that various modifications may be made without departing from the spirit and scope of the invention.

What is claimed is:

1. A test and measurement instrument comprising:
   an input circuit configured for receiving one or more input signals;
   an analog-to-digital converter configured for converting an input signal of the one or more input signals to a digital signal;
   an acquisition memory structured to store the digital signal; and
   a trigger subsystem having one or more event decoders operative responsive to one or more features of the one or more input signals or the digital signal to detect that a series of events occurred, and structured to generate a trigger signal in response to detecting that a final event in the series of events occurred,
   wherein the series of events is a series of recurring events, and a total number of recurring events in the series of events is unknown to the trigger subsystem prior to the detection of the occurrence of the final event in the series of events.

2. The test and measurement instrument according to claim 1, in which the trigger subsystem includes a trigger-on-final-event timer to store a final event duration, and in which generating the trigger signal occurs when no event of the series of events occurs within the final event duration after the occurrence of the last previously determined event in the series of events.

3. The test and measurement instrument according to claim 2, in which the trigger-on-final-event timer begins timing when an event is detected, and in which generating the trigger signal is suppressed when an event in the series of events is detected before the trigger-on-final-event timer expires.

4. The test and measurement instrument according to claim 3, in which the trigger-on-final-event timer is reset when an event in the series of events is detected.

5. The test and measurement system according to claim 2 in which the trigger-on-final-event timer is crystal controlled.

6. The test and measurement instrument according to claim 1, further comprising a timestamp indicator structured to indicate a timestamp associated to a particular portion of the data stored in the acquisition memory when the trigger signal is generated.

7. The test and measurement instrument according to claim 6, in which the timestamp is associated to a portion of the data related to the final event in the series of events.

8. The test and measurement instrument according to claim 6, in which the trigger subsystem includes a trigger-on-final-event timer to store a final event duration, and in which the timestamp is generated by subtracting the final event duration from a time when a timeout was determined to have occurred.

9. The test and measurement instrument according to claim 6, in which the timestamp indicator locates an approximate location of the final event in the stored digital data, and further comprising a correction facility structured to analyze the stored digital data to determine a specific location of the final event in the stored digital data.

10. The test and measurement instrument according to claim 1, in which the trigger subsystem includes an input structured to receive a forced timeout signal, and in which, when the forced timeout signal is received, the trigger subsystem indicates the final event in the series of events is the event most previously received before the forced timeout signal was received.

11. The test and measurement instrument according to claim 1 in which the digital data stored in the acquisition memory is marked with a temporary timestamp at detected events in the series of events.

12. The test and measurement instrument according to claim 1, in which the trigger system is structured to detect a first triggering event in the input signal or the digital signal before enabling the detection of the series of events.

13. A processor controlled method of generating a trigger in a test and measurement instrument, the method comprising:
   accepting an input signal by an input circuit;
   digitizing, by an analog-to-digital converter, the input signal into a digital signal;
   storing the digital signal in an acquisition memory;
   evaluating, by a trigger subsystem, the input signal or the digital signal for events in a series of events; and
   generating, by the trigger subsystem, the trigger when a final event in the series of events is detected,
   wherein the series of events is a series of recurring events, and a total number of recurring events in the series of events is unknown to the trigger subsystem prior to the detection of the occurrence of the final event in the series of events.

14. The method according to claim 13, in which generating the trigger comprises:
   starting a timer when an event in the series of events is detected; and
   generating the trigger if the timer finishes before detecting a next event in the series of events.

15. The method according to claim 14, in which the timer is a crystal controlled timer.

16. The method according to claim 13, further comprising indicating a timestamp in relation to the acquisition memory when the final event in the series of events occurs.

17. The method according to claim 16 further comprising refining a location of the timestamp by evaluating data stored in the acquisition memory.

18. The method according to claim 14, further comprising:
   detecting the final event in the series of events; and
   generating a timestamp in the acquisition memory by subtracting a period of time stored in the timer from a point in time when the final event in the series of events was detected.

19. The method according to claim 13, further comprising receiving a forced timeout signal, and in which an event of the series of events received prior to receiving the forced timeout signal is deemed to be the final event in the series of events.

20. The method according to claim 13, in which the series of events are not evaluated for a final event until another event occurs, the other event unrelated to the series of events.

* * * * *